(12) United States Patent  
Nishihara et al.

(10) Patent No.: US 8,009,474 B2
(45) Date of Patent: Aug. 30, 2011

(54) SEMICONDUCTOR STORAGE DEVICE AND READ VOLTAGE CORRECTION METHOD

(75) Inventors: Kiyohito Nishihara, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/775,221

(22) Filed: May 6, 2010

(65) Prior Publication Data

US 2010/0214847 A1  Aug. 26, 2010

Related U.S. Application Data

(62) Division of application No. 11/850,390, filed on Sep. 5, 2007, now abandoned.

(30) Foreign Application Priority Data

Sep. 6, 2006  (JP) ................................ 2006-241806

(51) Int. Cl.
*G11C 11/34* (2006.01)
(52) U.S. Cl. ......... 365/185.09; 365/185.11; 365/185.17; 365/185.18; 365/185.24; 365/185.29; 365/185.33
(58) Field of Classification Search ............. 365/185.09, 365/185.11, 185.17, 185.18, 185.24, 185.29, 365/185.33
See application file for complete search history.

(56) References Cited

U.S. PATENT DOCUMENTS

| 5,969,981 | A | 10/1999 | Kono |
| 6,642,568 | B2 | 11/2003 | Narita et al. |
| 6,687,155 | B2 | 2/2004 | Nagasue |
| 6,847,553 | B2 | 1/2005 | Chen et al. |
| 6,933,194 | B2 | 8/2005 | Narita et al. |
| 7,277,978 | B2 | 10/2007 | Khatami et al. |
| 7,304,891 | B2 | 12/2007 | Kim |
| 7,394,691 | B2 | 7/2008 | Shibata et al. |
| 7,457,164 | B2 | 11/2008 | Ohta |
| 7,495,955 | B2 | 2/2009 | Ido |
| 7,525,839 | B2 | 4/2009 | Shibata et al. |
| 7,551,478 | B2 | 6/2009 | Kanno |
| 7,561,468 | B2 * | 7/2009 | Hosono .................... 365/185.17 |
| 7,564,716 | B2 | 7/2009 | Syzdek et al. |
| 7,577,036 | B2 | 8/2009 | Sarin et al. |
| 7,649,776 | B2 * | 1/2010 | Abiko et al. ............. 365/185.17 |
| 7,710,787 | B2 * | 5/2010 | Whiston et al. .......... 365/185.29 |
| 7,719,900 | B2 * | 5/2010 | Okayama et al. ........ 365/185.18 |
| 7,835,182 | B2 * | 11/2010 | Hosono .................... 365/185.17 |
| 2008/0013380 | A1 | 1/2008 | Cornwell et al. |

FOREIGN PATENT DOCUMENTS

JP    3938309    4/2007

* cited by examiner

Primary Examiner — Trong Phan
(74) Attorney, Agent, or Firm — Oblon, Spivak, McClelland, Maier & Neustadt, L.L.P.

(57) ABSTRACT

A semiconductor memory device comprises a semiconductor memory, a corrected voltage storage circuit which stores a corrected voltage produced by correcting a read voltage of the semiconductor memory, and a memory controller which reads the corrected voltage from the corrected voltage storage circuit and performs a read operation of the semiconductor memory using the corrected voltage.

7 Claims, 9 Drawing Sheets

Reference chip CHIP(A)

| Vfg | Floating voltage |
|---|---|
| Cγ | Coupling ratio |
| Vcg | Gate voltage |
| Vth | Cell threshold voltage |
| Vt0 | Cell neutral threshold potential |
| Vpgm | Write voltage |
| Verase | Erase voltage |

FIG. 13A

To-be-corrected chip CHIP(B)

| Vfg' | Floating voltage |
|---|---|
| Cγ' | Coupling ratio |
| Vcg' | Gate voltage |
| Vth' | Cell threshold voltage |
| Vt0' | Cell neutral threshold potential |
| Vpgm0 | Write voltage |
| Verase0 | Erase voltage |

FIG. 13B

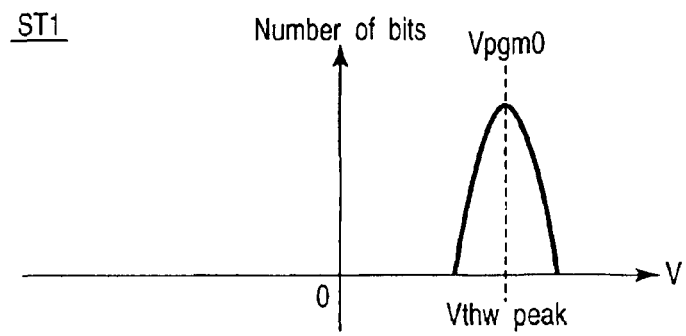

FIG. 14

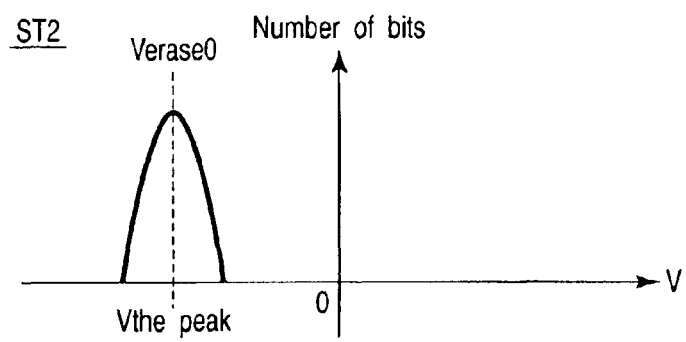

FIG. 15

SEMICONDUCTOR STORAGE DEVICE AND READ VOLTAGE CORRECTION METHOD

CROSS-REFERENCE TO RELATED APPLICATIONS

This application is a Divisional Application of U.S. Ser. No. 11/850,390, filed Sep. 5, 2007, which is hereby incorporated herein by reference in its entirety and claims the benefit from prior Japanese Patent Application No. 2006-241806, filed Sep. 6, 2006.

BACKGROUND OF THE INVENTION

1. Field of the Invention

The invention relates to a semiconductor storage device and a read voltage correction method for use with the storage device, which is, for example, a NAND type flash memory.

2. Description of the Related Art

Evaluation of the read disturb characteristic of NAND type flash memories (chips) on the same semiconductor wafer using the same read voltage reveals that the measurement of the read disturb characteristic varies from chip to chip (see, for example, JP-A 2002-016154 (KOKAI); corresponding to U.S. Pat. No. 6,933,914). This is expected to be attributed to memory characteristic variations resulting from various variations in processing during the manufacturing process. With the NAND type flash memories in particular, the coupling ratio and the neutral threshold of memory cells greatly affect the electric field strength in the tunnel insulating film when a read voltage (Vread) is being applied, which has a great influence upon the read disturb characteristic. Thus, the amounts of leakage current which occurs when the same read voltage is applied depend greatly upon these and influence the read disturb characteristic.

Thus, setting the read voltage Vread to a value common to all the semiconductor chips of a semiconductor wafer gives rise to variations in the amount of leakage current in the tunnel insulating film due to variations in the coupling ratio and neutral threshold, causing the read disturb characteristic to vary from chip to chip.

On the other hand, with present-day manufacturing process technology, it is practically impossible to obtain such precision that influence on variations in read disturb characteristic can be neglected.

With the conventional semiconductor storage devices, as described above, a read operation is performed on the basis of a common read voltage Vread. That is, no read operation is performed using a read voltage corrected so that the read disturb characteristic is optimized for each semiconductor chip. For this reason, the read disturb characteristic is not optimized and the number of fail bits increases, lowering the reliability.

In addition, in the conventional method of examination of semiconductor storage devices, the read voltage Vread is not corrected for each semiconductor chip so as to optimize the read disturb characteristic of each semiconductor chip.

For this reason, when a fixed common read voltage is used for all the semiconductor chips in a semiconductor wafer, faulty chips which fail to meet the standard read disturb characteristic increase in number and proper chips obtained from the wafer decrease in number, lowering the manufacturing yield.

BRIEF SUMMARY OF THE INVENTION

According to an aspect of the invention, there is provided a semiconductor storage device comprising: a semiconductor memory; a corrected voltage storage circuit which stores a corrected voltage produced by correcting a read voltage of the semiconductor memory; and a memory controller which reads the corrected voltage from the corrected voltage storage circuit and performs a read operation of the semiconductor memory using the corrected voltage.

According to another aspect of the invention, there is provided a read voltage correction method for use with a semiconductor storage device equipped with a reference chip and a to-be-corrected chip which has a corrected voltage storage circuit, comprising: obtaining a write voltage of the to-be-corrected chip; obtaining an erase voltage of the to-be-corrected chip; and correcting a read voltage of the to-be-corrected chip in accordance with the write and erase voltages obtained.

BRIEF DESCRIPTION OF THE SEVERAL VIEWS OF THE DRAWING

FIG. 13A shows values required with the read voltage correction method according to the embodiment;

FIG. 13B shows values required with the read voltage correction method according to the embodiment;

FIG. 14 shows one step in the read voltage correction method according to the embodiment;

FIG. 15 shows one step in the read voltage correction method according to the embodiment.

DETAILED DESCRIPTION OF THE INVENTION

Figure 1:
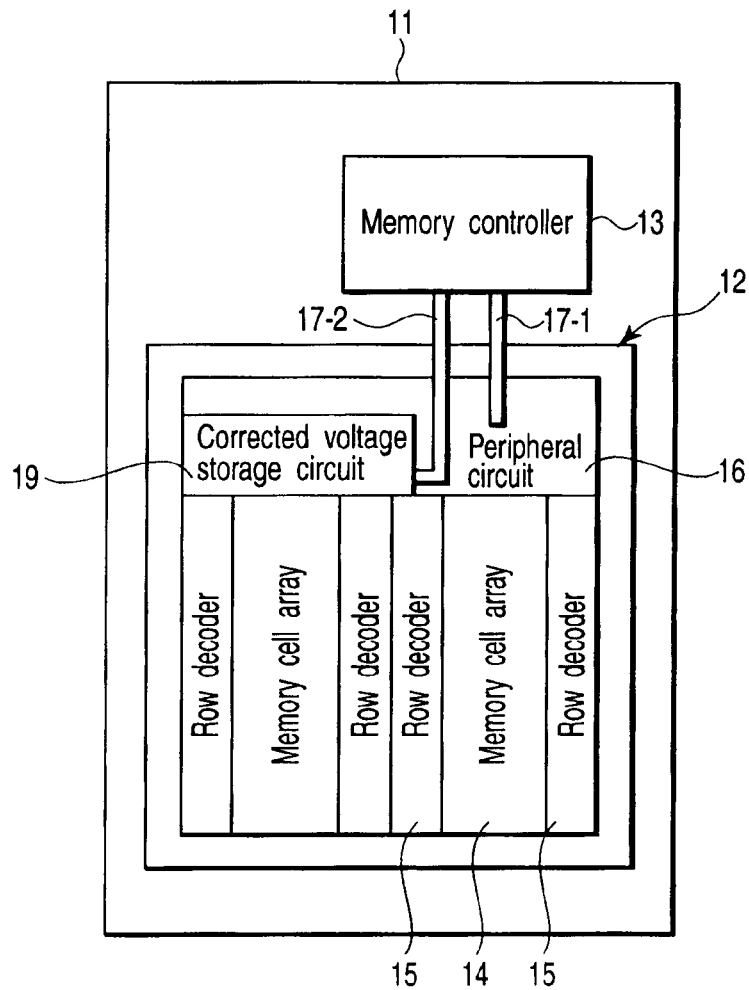
FIG. 1 is a plan view of a semiconductor storage device according to an embodiment of the present invention.

An embodiment of the present invention will be described hereinafter with reference to the accompanying drawings. In the description which follows, like reference characters are used to designate like or corresponding parts throughout the drawings.

Figure 2A:
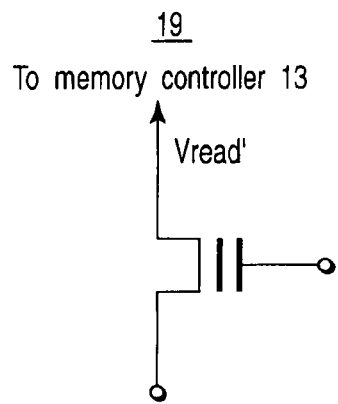
FIG. 2A shows an example of a circuit diagram of the corrected voltage storage circuit in FIG. 1.
Figure 2B:
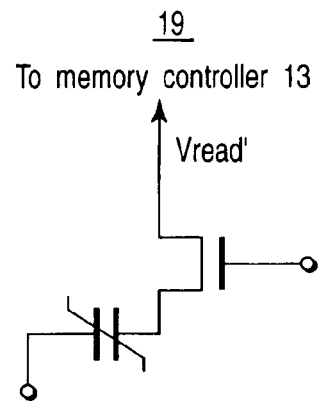
FIG. 2B shows another example of a circuit diagram of the corrected voltage storage circuit in FIG. 1.
Figure 3:
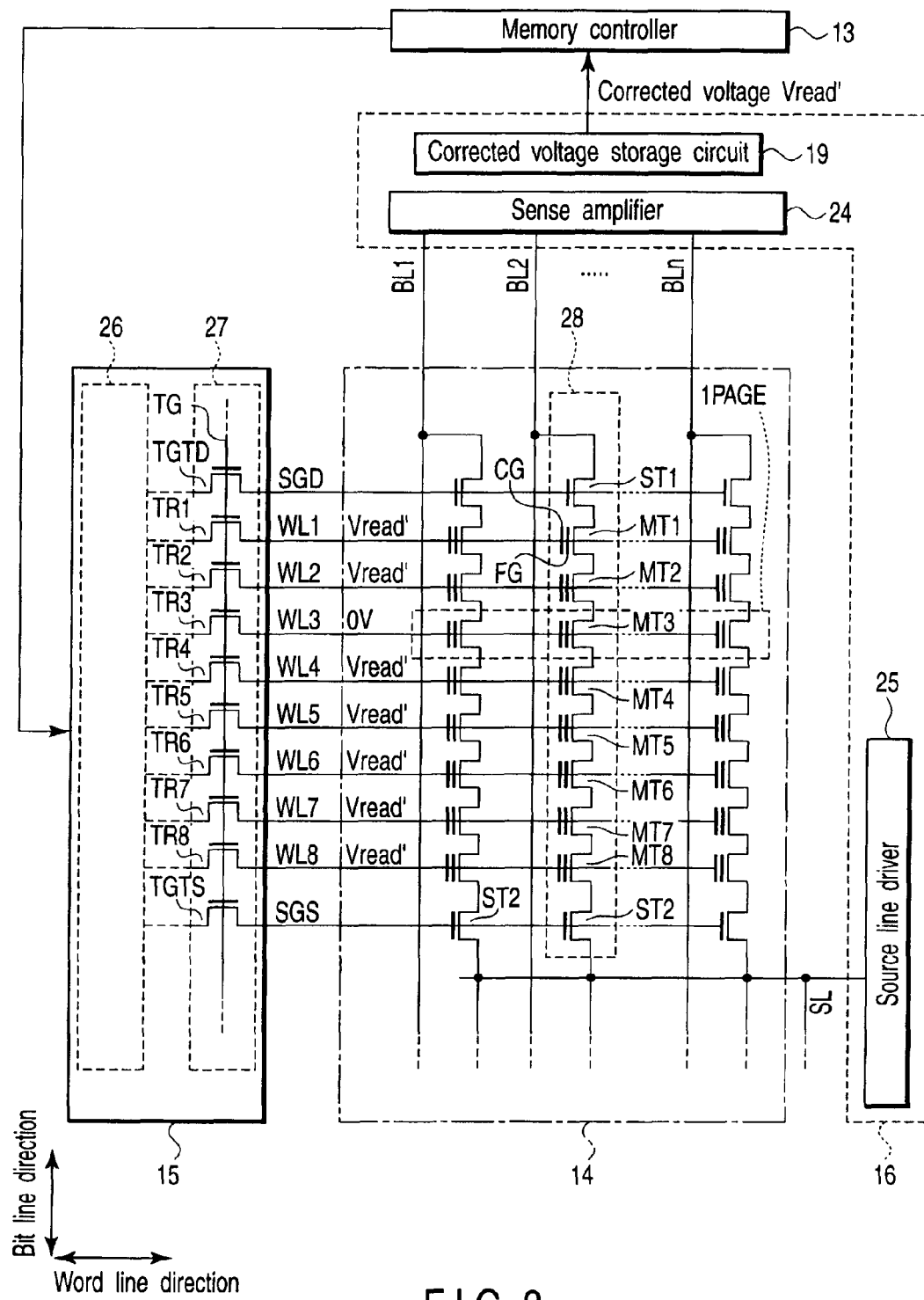
FIG. 3 shows a circuit arrangement of the NAND type flash memory in FIG. 1.

First, reference is made to FIGS. 1 through 3 to describe the arrangement of a semiconductor storage device according to an embodiment of the present invention. FIG. 1 is a plan view of the semiconductor storage device of this embodiment. FIG. 3 shows a circuit arrangement of the NAND type flash memory in FIG. 1.

As shown, a semiconductor chip 11 contains a NAND type flash memory 12, a corrected voltage storage circuit 19, and a memory controller 13.

The NAND type flash memory 12 has memory cell arrays 14 each of which has memory cell transistors MT arranged in the form of an array, row decoders 15 which select the memory cell arrays 14, and a peripheral circuit 16 equipped with sense amplifiers and the like. The NAND type flash memory 12 may be configured as an SLC (Single Level Cell) which is capable of recording 1-bit data in one memory cell transistor MT, or an MLC (Multi Level Cell) that is capable of recording multi-bit data in one memory cell transistor MT.

The corrected voltage storage circuit 19 is set in the peripheral circuit 16 of the NAND type flash memory 12 and configured to store a corrected voltage (Vread'). The corrected voltage Vread' is a read voltage in which the read voltage (Vread) of the NAND type flash memory 12 has been corrected according to a method to be described later. In a read operation, the corrected voltage Vread' is read by the memory controller 13 over an interconnect line 17-2.

As the corrected voltage storage circuit 19, use may be made of a circuit having a memory cell of a flash memory or ferroelectric memory (FeRAM: Ferroelectric Random Access Memory). A representative example of a flash memory cell of the corrected voltage circuit, as shown in FIG. 2A, includes a transistor which has its current path connected at one end to the memory controller 13 and at another end (terminal) to a corresponding bit line (not depicted). A terminal of the gate of this transistor is connected to a word line (not depicted). A representative example of a FeRAM memory cell of the corrected voltage circuit, as shown in FIG. 2B, includes a transistor connected at one end to a capacitor and at another end to the memory controller 13. A terminal on a side of the capacitor not connected to the transistor is connected to a ground (not depicted) and a terminal of the gate of the transistor depicted in FIG. 2B is connected to a world line (not depicted). In addition, a part of the memory cell array 14 may also be used as the flash memory to reduce the area of the circuit. Alternatively, the corrected voltage storage circuit may be formed of an SRAM (Static Random Access Memory) or MRAM (Magnetic Random Access Memory) memory cell to store the corrected voltage Vread'.

The memory controller 13 is configured to control the internal physical states of the NAND type flash memory 12 (e.g., which logical sector address data is contained in which physical block addresses, or which block is in erased state), and, in a read operation, to read the corrected voltage Vread' from the corrected voltage storage circuit 19 and read from the NAND type flash memory 12 using the corrected read voltage Vread'. In addition, the controller 13 performs data input/output control and data management on the flash memory 12, adds error correction codes (ECC) upon writing, and analyzes the error correction codes upon reading.

Next, the exemplary arrangement of the NAND type flash memory 12 will be described with reference to FIG. 3. As shown, the NAND flash memory 12 is equipped with the row decoder 15, the memory cell array 14, a sense amplifier 24, and a source line driver 25.

The row decoder 15 is configured to select word lines WL1 to WL8 and select gate lines SGD and SGS in accordance with an address from an address buffer (not shown). The row decoder 15 has a row main decoder circuit 26 and a core unit (row sub-decoder circuit) 27.

The row main decoder circuit 26 decodes a row address signal to send a row address decoded signal to the core unit 27. The core unit 27 is equipped with transfer gate transistors TGTD and TGTS and transfer transistors TR1 to TR8, which have their gates connected together to a transfer gate line TG.

The memory cell array 14 is equipped with NAND cell columns 28 each of which is composed of select transistors ST1 and ST2 and memory cell transistors MT1 to MT8 which have their current paths connected in series. The transistors in the memory cell array are arranged in a matrix form. One end of the series-connected current paths of the transistors is connected to the sense amplifier 24 and the other end is connected to a source line SL.

Each of the memory cell transistors MT1 to MT8 is a stacked structure having a tunnel insulating film formed on a semiconductor substrate ("Si-sub"), a floating gate FG formed on the tunnel insulating film, an intergate insulating film formed on the floating gate, and a control gate CG formed on the intergate insulating film. The memory cell transistor MT1 to MT8 are arranged to adjoin one another along the direction of bit lines so that adjacent transistors share their source and drain.

The number of the memory transistors MT is not limited to eight as in this example but may be 16, 32, etc. One of the paired select transistors ST1 and ST2 may be omitted provided that the corresponding NAND cell column 28 can be selected.

The control gates CG of the memory cell transistors MT in the same row in the direction of word lines orthogonal to the direction of bit lines are connected together at one of the word lines WL1 to WL8. The gates of the select transistors ST1 and ST2 in the same column in the direction of word lines are connected commonly to either of the select gates SGD and SGS, respectively. The drain of each of the select transistors ST1 is connected to a respective one of the bit lines BL1 to BLn. The sources of the select transistors ST2 are connected together to the source line SL, which is in turn connected to the source line driver 25.

The sense amplifier 24 is arranged in the peripheral circuit 16 and configured to amplify data read from a selected memory cell transistor MT.

The source line driver 25 is set in the peripheral circuit 16 and configured to apply a source voltage to the source line SL.

[Read Operation]

Figure 4:
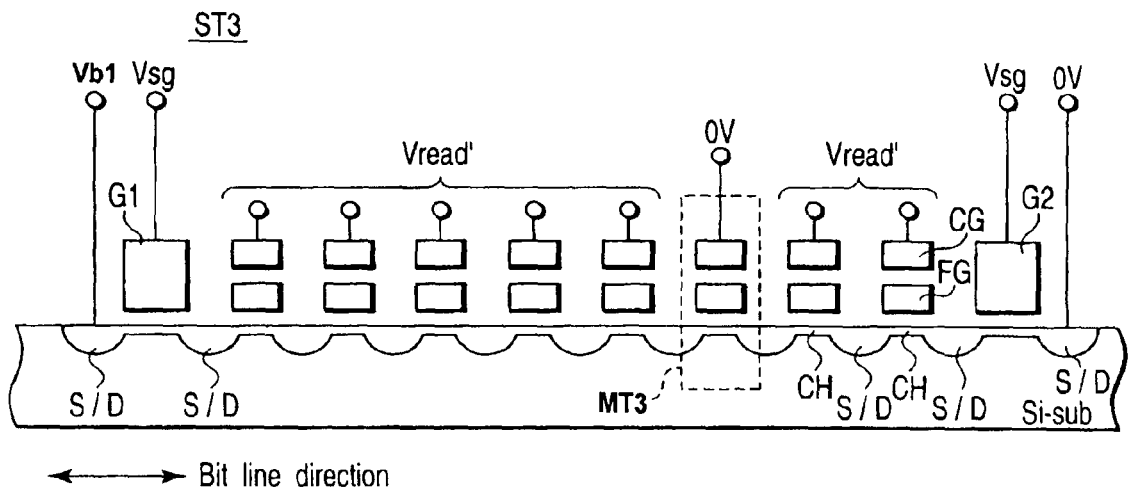
FIG. 4 is a sectional view of a column of NAND cells in a read operation of the semiconductor storage device according to the embodiment.

The read operation of the semiconductor storage device of this embodiment will be described next with reference to FIGS. 3 to 5. The read operation of the NAND type flash memory 12 is performed on a word line basis (on a page-by-page basis); however, to simplify the description, reading from the memory cell transistor MT3 will be described here as an example. FIG. 4 is a schematic sectional view of the NAND cell column 28 in this read operation.

First, as shown in FIG. 3, the memory controller 13 reads the corrected voltage Vread' from the corrected voltage storage circuit 19.

Next, the memory controller 13 controls the row decoder 15, the source line driver 25, and the sense amplifier 24 so that potentials shown in FIG. 4 are applied to the memory cell array 14.

That is, the row decoder 15 drives the transfer transistors TR1 to TR8 so that the corrected voltage Vread' is applied to the control gates CG of the nonselected memory cell transistors MT1, MT2, and MT4 to MT8 and 0 volts (predetermined potential) are applied to the control gate of the selected memory cell transistor MT3. The row decoder 15 drives the transfer gate transistors TGTD and TGTS so that a voltage Vsg to turn on the select transistors ST1 and ST2 is applied to the gate electrodes G1 and G2 of the select transistors ST1 and ST2. The source line driver 25 is controlled to apply 0 volts to the source S/D of the select transistor ST1 and the sense amplifier 24 is controlled to apply a voltage Vb1 to the drain of the select transistor ST1.

According to the condition of the charges stored at the float gate in the selected memory cell transistor MT3, the memory cell transistor is turned on or turned off. As a result, the channels CH of the nonselected memory cell transistors MT1, MT2 and MT4 to MT8 are rendered conductive by the corrected voltage Vread' and, according to the ON/OFF condition of the selected memory cell transistor MT3, electric current passing through the conductive channels CH is varied. As a result, the sense amplifier 24 detects occurrence of the variation in the sense node stored in the capacity of the sense amplifier 24, thereby completing the read operation.

As described above, the row decoder 15 drives the transfer transistors TR1, TR2, and TR4 to TR8 so that the corrected voltage Vread' is applied to the control gates CG of the nonselected memory cell transistors MT1, MT2, and MT4 to MT8.

Figure 5:
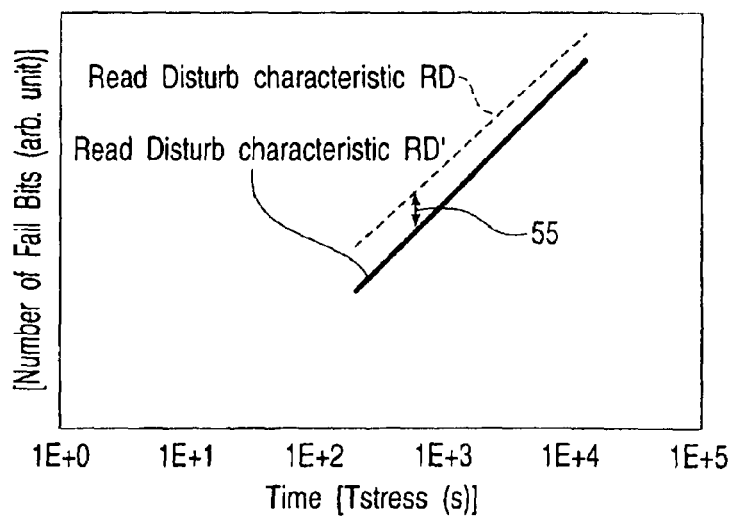
FIG. 5 shows the read disturb characteristic of the semiconductor storage device according to the embodiment.

For this reason, as shown in FIG. 5, the read disturb characteristic RD' can be improved. In FIG. 5, a solid line RD' indicates the read disturb characteristic based on the corrected voltage Vread' in this example, whereas a broken line RD represents the read disturb characteristic based on a non-corrected read voltage. Generally, with reference to FIGS. 5, 7-9, and 16, time ("Tstress(s)") refers to the amount of time in seconds that memory cells have their threshold voltages increased above a certain threshold voltage Vth and ("arb-unit") denotes an arbitrary unit.

As shown, the solid line RD' when a read operation is performed using the corrected voltage Vread' lies below the broken line RD at any time; therefore, it can be seen that the number of fail bits can be reduced. For example, at time $10^3$ [s], about 1000 fail bits can be reduced as indicated by the difference 55.

Thus, the read disturb characteristic RD' can be improved and the number of fail bits can be reduced. Therefore, the reliability of the NAND type flash memory 12 is increased.

Here, the read disturb characteristic will be described with reference to FIGS. 6 to 9.

As described above, in a read operation, it is required to turn on nonselected memory cell transistors by applying a read voltage onto nonselected word lines.

Figure 6:
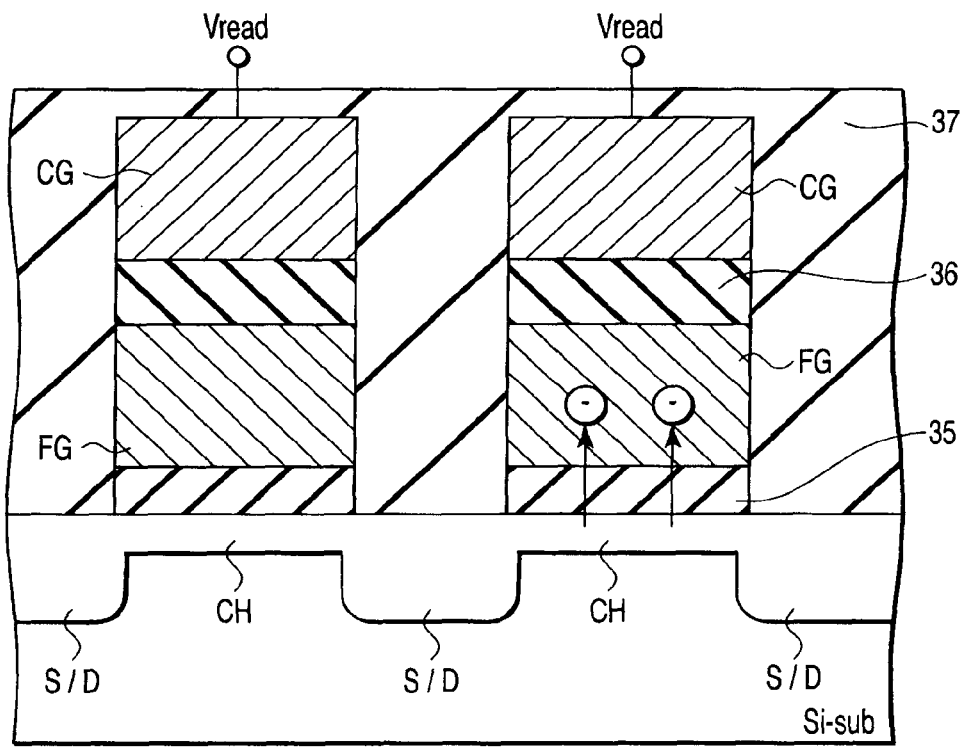
FIG. 6 is a sectional view for use in explanation of the read disturb characteristic.

As shown in FIG. 6, at this point, the read voltage applied to the tunnel insulating films of the nonselected memory cell transistors can cause electrons to leak from the substrate to the floating electrodes FG, thereby causing weak writing to occur. As a result, the threshold voltages of the nonselected memory cell transistors rise and data change occurs, which leads to read disturb.

Figure 7:
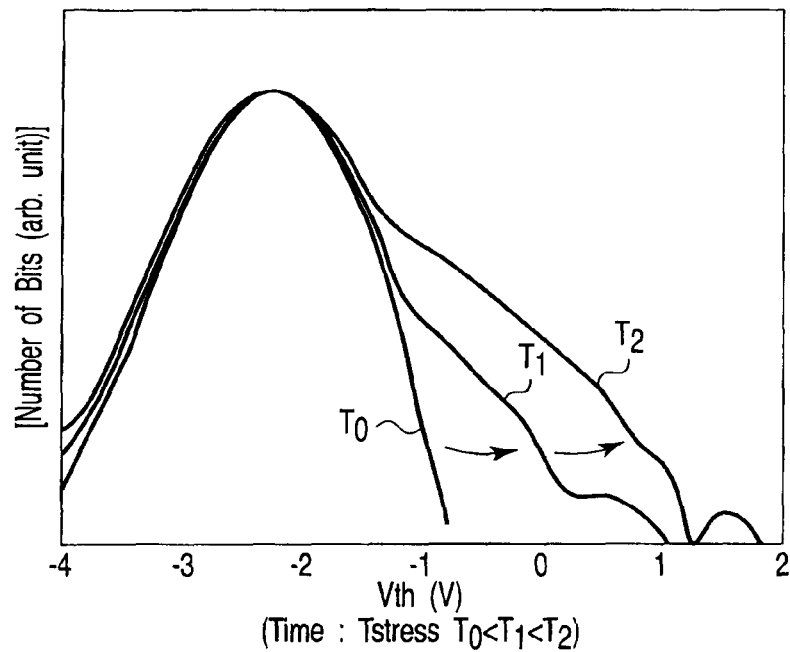
FIG. 7 is a diagram for use in explanation of the read disturb characteristic.

The cells which are faster in threshold rise are defined to be poor in the read disturb characteristic and appear as the base of a distribution by continuing the read operation. For example, FIG. 7 shows the relationship between the total number of fail bits and the time (Tstress) with cells having their threshold voltages increased above a certain threshold voltage Vth as fail bits. As shown, although the threshold voltage distribution exhibits a normal distribution at time T0, the cells the threshold voltage rise increase with the lapse of time from T1 to T2.

Figure 8:
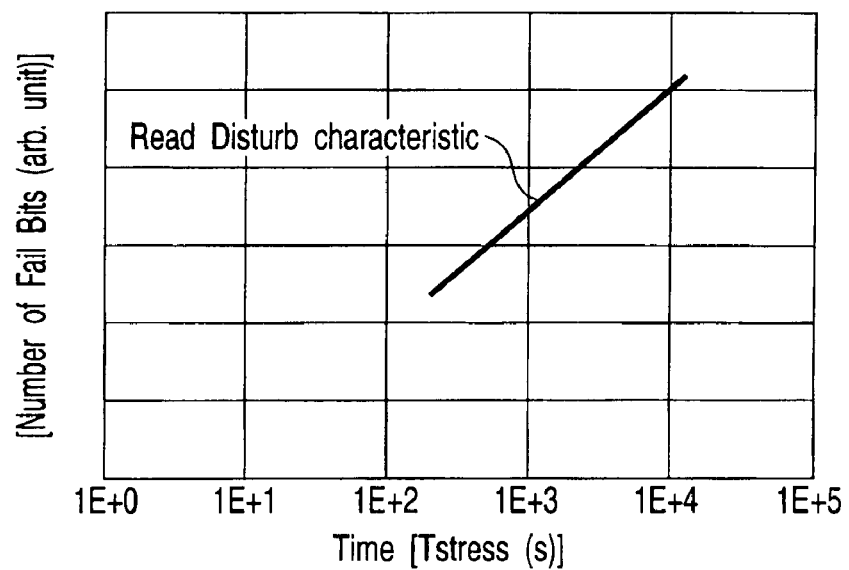
FIG. 8 shows the read disturb characteristic.

As shown in FIG. 8, the read disturb characteristic is obtained from the relationship between the time (Tstress) and the number of memory cell transistors having threshold voltages increased above a certain value (the number of fail bits). The lower the characteristic line lies below the Y axis, the better the characteristic is.

Figure 9:
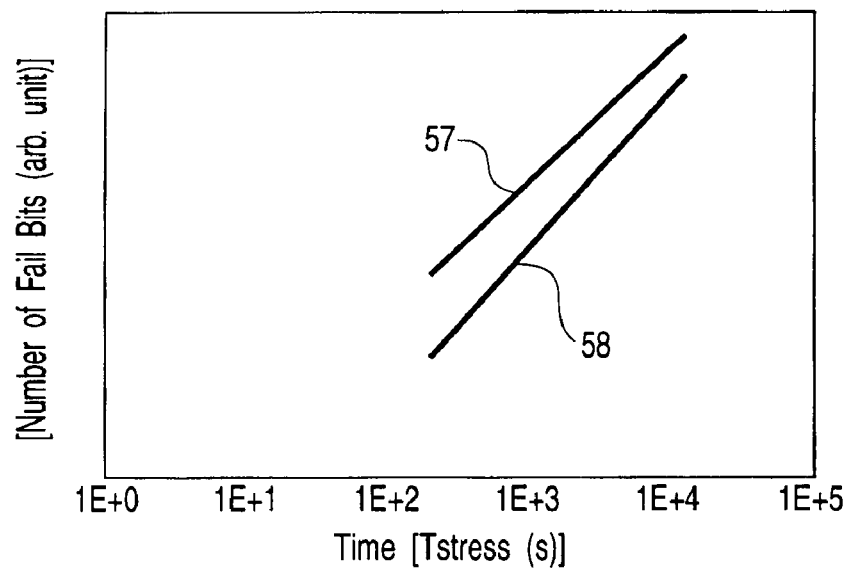
FIG. 9 shows the read disturb characteristics of different semiconductor chips obtained from the same silicon wafer.

FIG. 9 shows read disturb characteristics of separate semiconductor chips obtained from the same silicon wafer. For example, FIG. 9, even with semiconductor chips obtained from the same silicon wafer, variations occur in the read disturb characteristic due to various variations in processing in the manufacturing process. For example, variations include variations in the thickness of the tunnel insulating film 35 and variations in the shape of the control electrode CG shown in FIG. 6. The read disturb characteristic indicated by solid line 57 lies above the characteristic indicated by solid line 58, exhibiting that the former is poorer than the latter.

In this embodiment, however, as shown in FIG. 5, the characteristic line RD' when a read operation is performed using the corrected voltage Vread' lies below the characteristic line RD at any time, thus allowing the number of fail bits to be reduced. Thus, the embodiment has advantages in that the read disturb characteristic can be improved, the number of fail bits can be reduced, and the reliability can be increased irrespective of variations in processing in the manufacturing process.

[Read Voltage Correction Method]

Next, the read voltage correction method for use with the semiconductor storage device according to this embodiment will be described with reference to FIGS. 10 to 16. The correction method of this embodiment involves, to improve the read disturb characteristic, making a predetermined correction to a read voltage to determine a corrected voltage Vread' for each semiconductor chip and then storing this corrected voltage into the corresponding corrected voltage storing circuit 19.

Figure 10:
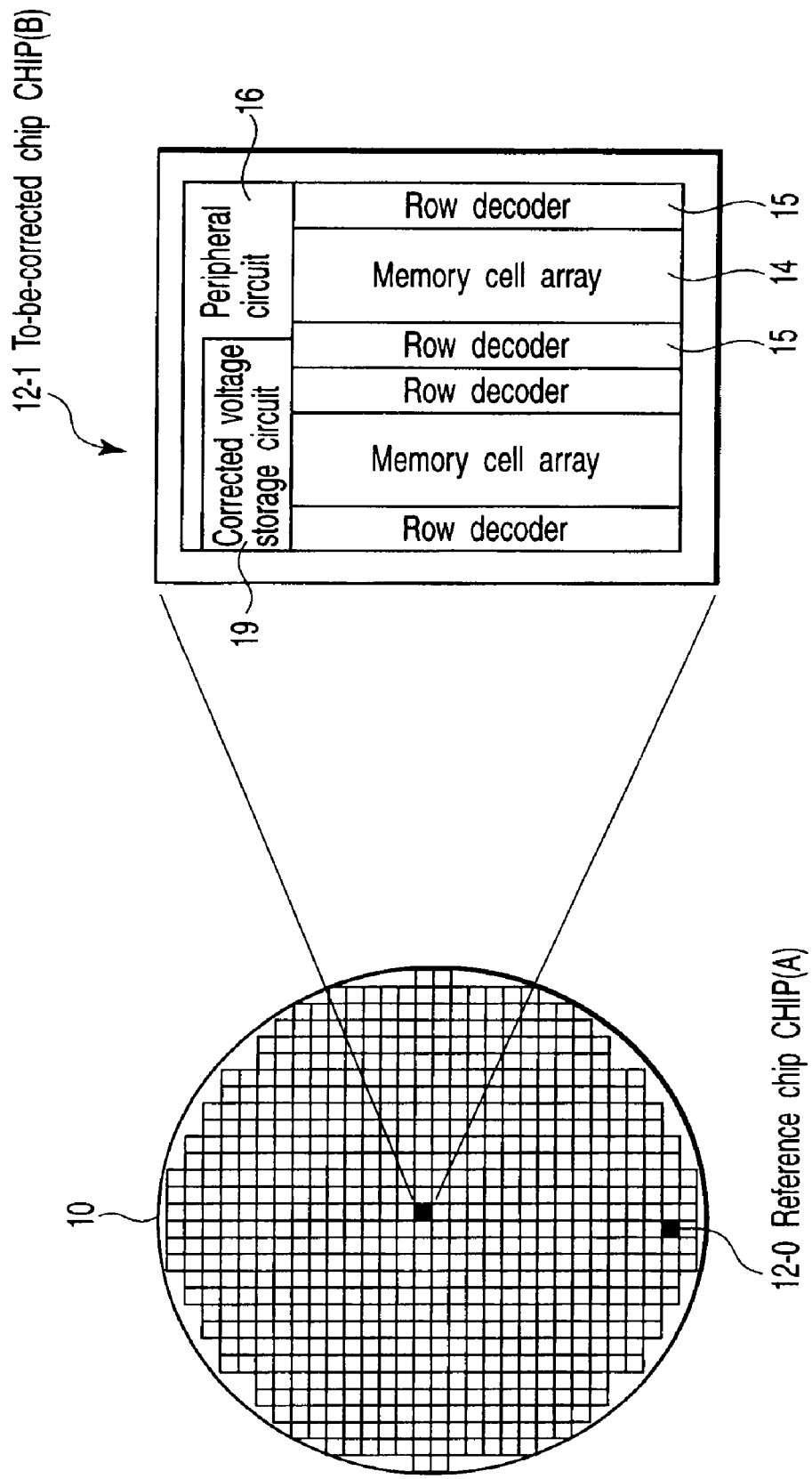
FIG. 10 is a plan view for use in explanation of a read voltage correction method for use with the semiconductor storage device according to the embodiment.

FIG. 10 is a plan view illustrating a large number of NAND type flash memories 12 formed on a silicon wafer 10 before dicing.

As shown, the controller 13 is not yet incorporated into the chip. In this state, the read voltage correction is made.

Here, a description is given with a NAND type flash memory 12-0 as a reference chip CHIP(A) for this correction method and a NAND type flash memory which is an object of correction as a to-be-corrected chip CHIP (B). Although, in this example, the reference chip CHIP(A) and the to-be-corrected chip CHIP(B) are described as semiconductor chips formed on the same silicon wafer, they may be ones formed on separate silicon wafers.

Figure 11:
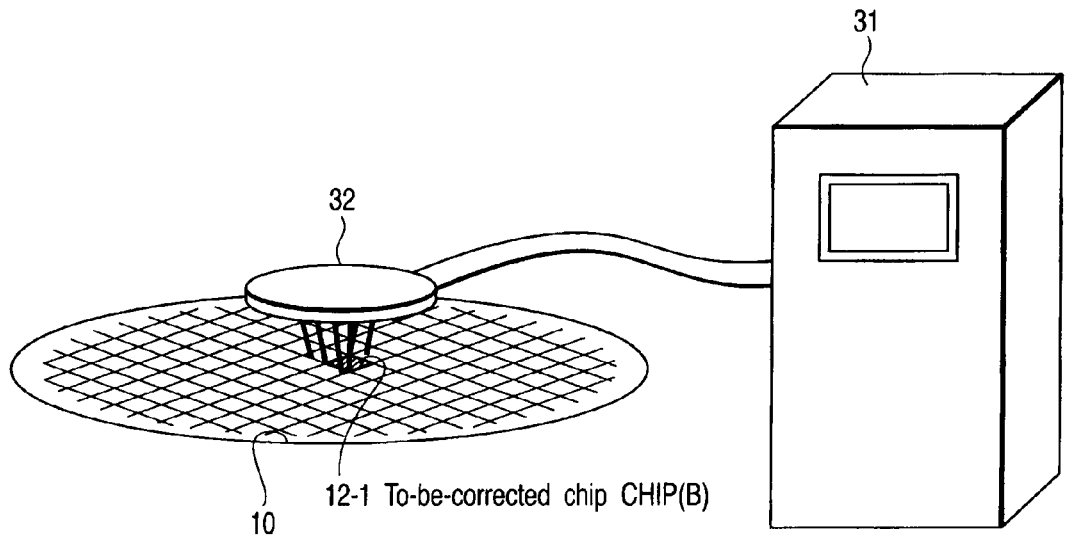
FIG. 11 is a diagram for use in explanation of the read voltage correction method for use with the semiconductor storage device according to the embodiment.
Figure 12:
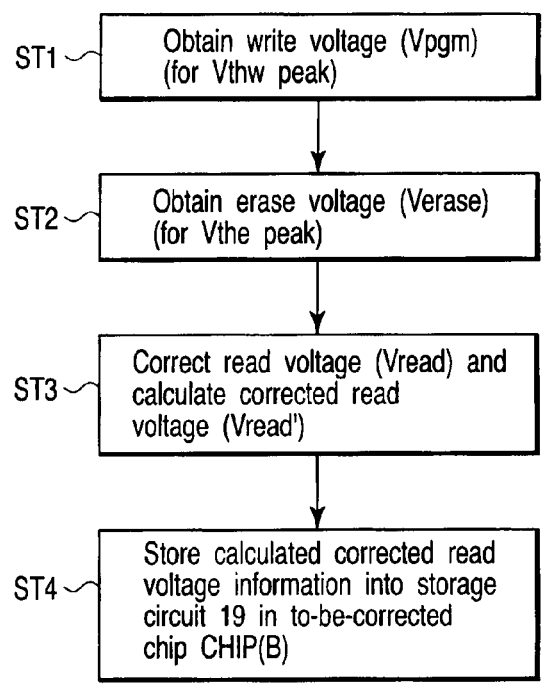
FIG. 12 is a flowchart for use in explanation of the read voltage correction method according to the embodiment.

As shown in FIG. 11, required values in this description are detected by a probe 32 electrically connected to the NAND type flash memory 12-1 and processed and displayed by a tester 31. FIG. 11 shows the state in which the required values are detected from the to-be-corrected chip CHIP(B). The read voltage correction method of this embodiment is performed in accordance with steps ST1 to ST4 shown in FIG. 12.

FIGS. 13A and 13B show values required with the correction method. FIG. 13A shows the following required values for the reference chip CHIP(A): floating voltage Vfg, coupling ratio Cγ, gate voltage Vcg, cell threshold voltage Vth, cell neutral threshold potential Vt0, write voltage Vpgm, and erase voltage Verase. FIG. 13B shows the following required values for the to-be-corrected chip CHIP(B): floating voltage Vfg', coupling ratio Cγ', gate voltage Vcg', cell threshold voltage Vth', cell neutral threshold potential Vt0', write voltage Vpgm0, and erase voltage Verase0. Of the values shown, values to be measured are the write voltage Vpgm0 and the erase voltage Verase0 of the to-be-corrected chip CHIP(B). The other values are determined by calculations using expressions to be described later.

[Step ST1]

First, as shown in FIG. 14, a write operation is performed on a considerable number of memory cell transistors MT (e.g., of the order of several megabits) and the distribution of their threshold voltages Vth is processed and displayed by the tester 31. The write voltage Vpgm0 of the to-be-corrected chip CHIP(B) is then obtained from the analysis of the maximum value (Vthw peak) in the distribution.

[Step S2]

Then, as shown in FIG. 15, an erase operation is performed on a considerable number of memory cell transistors MT and the distribution of their threshold voltages Vth is processed and displayed by the tester 31. The erase voltage Verase0 of the to-be-corrected chip CHIP(B) is then obtained from the analysis of the maximum value (Vthe peak) in the distribution.

[Step ST3]

Next, the corrected voltage Vread' is calculated according to the following expressions using the write voltage Vpgm0 and the erase voltage Verase0 of the to-be-corrected chip CHIP(B) thus obtained.

First, the floating gate voltage Vfg of the reference chip CHIP(A) is expressed by $$Vfg = C\gamma(Vcg - Vth + Vt0) \quad (*)$$

where $C\gamma$ is the coupling ratio of the reference chip CHIP(A), Vcg is the gate potential of the reference chip CHIP(A), Vth is the cell threshold potential, and Vt0 is the cell neutral threshold of the reference chip CHIP(A). Designed values can be used as the coupling ratio, the cell threshold potential and the cell neutral threshold. If more exact values are needed, they can be obtained by measuring TEG (TEST ELEMENT GROUP) of the memory cell transistor. The coupling ratio indicates a ratio of the voltage applied to the tunnel insulation film, of the voltages applied to the control gate On the other hand, the floating gate voltage Vfg' of the to-be-corrected chip CHIP(B) is expressed as follows:

$$Vfg' = C\gamma'(Vcg' - Vth + Vt0') \quad (**)$$

where $C\gamma'$ is the coupling ratio of the to-be-corrected chip CHIP(B), Vcg' is the gate potential of the to-be-corrected chip CHIP(B), Vth is the cell threshold potential, and Vt0' is the cell neutral threshold of the to-be-corrected chip CHIP(B). Similarly to the reference chip (A), values obtained by measuring TEG are used as the coupling ratio, the cell threshold potential and the cell neutral threshold.

If it is known here that the to-be-corrected chip CHIP(B) is higher in neutral threshold than the reference chip CHIP(A) by $\alpha$. When, the cell neutral threshold Vt0' of the to-be-corrected chip CHIP(B) and are related by $$Vt0' = Vt0 + \alpha$$

Using the write voltage Vpgm and the erase voltage Verase of the reference chip CHIP(A) and the write voltage Vpgm0 and the erase voltage Verase0 of the to-be-corrected chip CHIP(B), $\alpha$ is expressed by $$\alpha = (Vpgm0 + Verase0)/2 - (Vpgm + Verase)/2$$

Using the coupling ratio coefficient $\beta$, the coupling ratio $C\gamma'$ of the to-be-corrected chip CHIP(B) is expressed by $$C\gamma' = \beta \times C\gamma$$

The coupling ratio coefficient $\beta$ is expressed by $$\beta = 100 \times [\{(Vpgm - Verase) - (Vpgm0 - Verase0)\}]/2/Vpgm$$

From the above expressions, the gate voltage Vcg' of the to-be-corrected chip CHIP(B) is calculated as follows:

$$Vcg' = (C\gamma \div C\gamma') \times Vcg + (Vt - Vt0) \times \{1 - (C\gamma' \div C\gamma)\} - \alpha$$

From the above, the corrected voltage Vread' of the to-be-corrected chip CHIP(B) can be determined by $$Vread' = (C\gamma' \div C\gamma) \times Vread + (Vt - Vt0) \times \{1 - (C\gamma' \div C\gamma)\}$$

[Step T4]

Next, the corrected voltage Vread' thus determined is stored in the corrected voltage storage circuit 19 in the to-be-corrected chip CHIP(B).

The read voltage correction method for use with the semiconductor storage device according to this embodiment offers at least the following advantages (1) and (2):

(1) The manufacturing yield can be improved.

As described above, the correction method of this embodiment involves obtaining the write voltage Vpgm0 and the erase voltage Verase0 of the to-be-corrected chip CHIP(B), determining the corrected voltage Vread' of the chip CHIP(B) according to the above calculations, and storing the corrected voltage in the corrected voltage storage circuit 19 of the chip CHIP(B).

Figure 16:
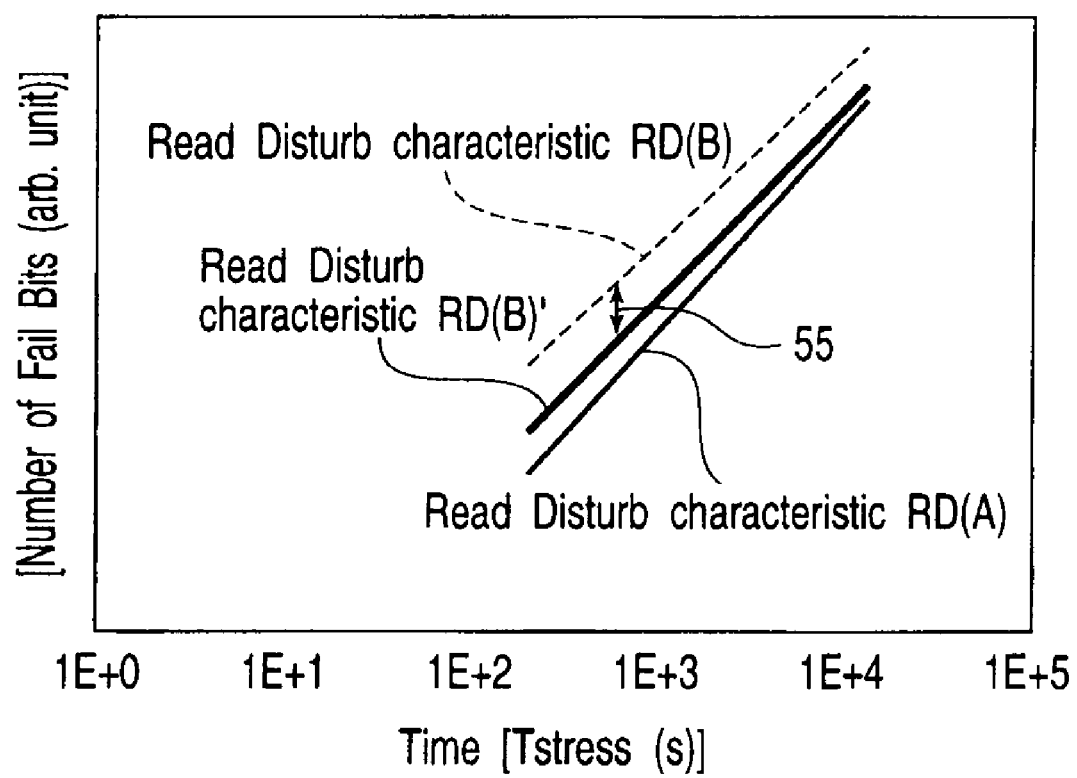
FIG. 16 shows the read disturb characteristic after the read voltage correction method according to the embodiment has been performed.

Therefore, the read disturb characteristic RD(B)' of the to-be-corrected chip CHIP(B) can be improved as shown in FIG. 16. In this figure, the solid line RD(B) indicates the read disturb characteristic of the to-be-corrected chip CHIP(B) based on the corrected voltage Vread', whereas the broken line RD(B) indicates the read disturb characteristic of the to-be-corrected chip CHIP(B) based on a read voltage before correction. The solid line RD(A) indicates the read disturb characteristic of the reference chip CHIP(A).

As shown, the solid line RD(B) lies close to the solid line RD(A) indicating the read disturb characteristic of the reference chip CHIP(A). It can be seen that, with the solid line RD(B)', the number of fail bits is less than that with the broken line RD(B) at any time.

On the other hand, the conventional examination of the read disturb characteristic has been made by performing a read operation using a common read voltage Vread. For this reason, the number of faulty chips which do not meet a standard read disturb characteristic (for example, chips having the read disturb characteristic indicated by the broken line RD(B) in FIG. 16) increases and hence the number of appropriate chips which can be obtained from a silicon wafer decreases; thus, the manufacturing yield tends to lower.

In this embodiment, however, the corrected voltage Vread' that optimizes the read disturb characteristic can be calculated for each chip. Therefore, even chips which would be treated as faulty chips if a common read voltage Vread were used can be corrected as available proper chips (for example, corrected chips CHIP(B) having the read disturb characteristic indicated by the solid line (RD(B) in FIG. 16).

For this reason, the number of appropriate chips which can be obtained from a semiconductor wafer can be increased, allowing the manufacturing yield to be increased.

(2) An increase in manufacturing cost can be suppressed.

With the method of this embodiment, in examining the read disturb characteristic it is only necessary to obtain required values through the use of the probe 32 and the tester 31 and perform given calculations. For this reason, there is no need of using high-accuracy exposure equipment that suppresses variations in the cell shape of memory cell transistors MT and the read disturb characteristic can be improved without changing the manufacturing process, which is effective in suppressing an increase in manufacturing cost. It is more effective in suppressing the increase in manufacturing cost, by adding the examination of the read disturb characteristic in examinations of the electric characteristics prior to dicing.

For example, the introduction of high-accuracy exposure equipment of shorter wavelengths would involve a manufacturing cost of the order of hundreds of millions of yen. If the number of photomasks were increased with changes in manufacturing process, a manufacturing cost of the order of millions of yen would be involved for each mask. However, the embodiment can provide the same advantages without involving such manufacturing costs.

In addition, at the time of examination, the correction method of this embodiment simply obtains the write voltage Vpgm0 and the erase voltage Verase0 of an object chip and performs predetermined calculations; therefore, the examination time will not be increased.

The embodiment has been described in terms of a semiconductor chip which contains a corrected voltage storage circuit to store a corrected read voltage and a read voltage correction method for use with that semiconductor chip. However, even with a semiconductor chip equipped with a corrected voltage storage circuit that stores a corrected write voltage, the same advantages could be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A read voltage correction method for use with a semiconductor storage device equipped with a reference semiconductor memory and a to-be-corrected semiconductor memory which has a corrected voltage storage circuit, comprising:
    obtaining a write voltage of the to-be-corrected semiconductor memory;
    obtaining an erase voltage of the to-be-corrected semiconductor memory; and
    correcting a read voltage of the to-be-corrected semiconductor memory in accordance with the write and erase voltages obtained.

2. The method according to claim 1, further comprising storing the corrected read voltage into the corrected voltage storage circuit of the to-be-corrected semiconductor memory.

3. The method according to claim 1, wherein the corrected read voltage is given by $$(C\gamma' \div C\gamma) \times V\text{read} + (Vt - Vt0) \times \{1 - (C\gamma' \div C\gamma)\}$$

wherein $C\gamma'$ is a coupling ratio of the to-be-corrected semiconductor memory, $C\gamma$ is a coupling ratio of the reference semiconductor memory, Vread is the read voltage of the to-be-corrected semiconductor memory before correction, Vt is a threshold voltage of memory cells of the reference semiconductor memory, and Vt0 is a neutral threshold voltage of the memory cells of the reference semiconductor memory.

4. The method according to claim 1, wherein a floating gate potential Vfg of the reference semiconductor memory is expressed by $$Vfg = C\gamma(Vcg - Vth + Vt0)$$

where Vcg is a gate potential of the reference semiconductor memory, Vth is a cell threshold potential, $C\gamma$ is a coupling ratio of the reference semiconductor memory and Vt0 is neutral threshold voltage of the memory cells of the reference semiconductor memory.

5. The method according to claim 1, wherein a floating gate potential Vfg' of the to-be-corrected semiconductor memory is expressed by $$Vfg' = C\gamma'(Vcg' - Vth + Vt0')$$

where $C\gamma'$ is a coupling ratio of the to-be-corrected semiconductor memory, Vcg' is a gate potential of the to-be-corrected semiconductor memory, Vth is a cell threshold potential, and Vt0' is a cell neutral threshold of the to-be-corrected semiconductor memory.

6. The method according to claim 1, wherein values necessary for the correction method are detected by a probe which is electrically connected to the reference semiconductor memory or the to-be-corrected semiconductor memory and then processed and displayed by a tester.

7. The method according to claim 6, wherein an examination of a read disturb characteristic is added to examinations of electric characteristics prior to dicing.

* * * * *